US010446727B2

(12) United States Patent
Hu et al.

(10) Patent No.: US 10,446,727 B2
(45) Date of Patent: *Oct. 15, 2019

(54) OHMIC CONTACTS FOR SEMICONDUCTOR STRUCTURES

(71) Applicant: Micron Technology, Inc., Boise, ID (US)

(72) Inventors: Yongjun Jeff Hu, Boise, ID (US); John Mark Meldrim, Boise, ID (US); Shanming Mou, Boise, ID (US); Everett Allen McTeer, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 4 days.

This patent is subject to a terminal disclaimer.

(21) Appl. No.: 15/399,372

(22) Filed: Jan. 5, 2017

(65) Prior Publication Data
US 2017/0117449 A1 Apr. 27, 2017

Related U.S. Application Data

(60) Continuation of application No. 14/261,901, filed on Apr. 25, 2014, which is a division of application No. 12/787,211, filed on May 25, 2010, now abandoned.

(51) Int. Cl.
H01L 33/62 (2010.01)
H01L 33/40 (2010.01)
(Continued)

(52) U.S. Cl.
CPC .......... H01L 33/62 (2013.01); H01L 33/0066 (2013.01); H01L 33/0075 (2013.01);
(Continued)

(58) Field of Classification Search
USPC .................................................. 438/22, 660
(Continued)

(56) References Cited

U.S. PATENT DOCUMENTS 5,124,779 A   6/1992 Furukawa et al.
5,652,434 A   7/1997 Nakamura et al.
(Continued)

FOREIGN PATENT DOCUMENTS

CN   102947956 A    2/2013
CN   102947956 B    12/2016
(Continued)

OTHER PUBLICATIONS

"Chinese Application Serial No. 201180031071.2 Response filed May 25, 2015 to Office Action dated Jan. 14, 2015", With the English claims, 8 pgs
(Continued)

Primary Examiner — Hrayr A Sayadian
(74) Attorney, Agent, or Firm — Schwegman Lundberg & Woessner, P.A.

(57) ABSTRACT

A composition and method for formation of ohmic contacts on a semiconductor structure are provided. The composition includes a $TiAl_xN_y$ material at least partially contiguous with the semiconductor structure. The $TiAl_xN_y$ material can be $TiAl_3$. The composition can include an aluminum material, the aluminum material being contiguous to at least part of the $TiAl_xN_y$ material, such that the $TiAl_xN_y$ material is between the aluminum material and the semiconductor structure. The method includes annealing the composition to form an ohmic contact on the semiconductor structure.

18 Claims, 6 Drawing Sheets

(51) Int. Cl.
*H01L 33/00* (2010.01)
*H01L 33/32* (2010.01)
*H01L 33/46* (2010.01)

(52) U.S. Cl.
CPC .............. *H01L 33/40* (2013.01); *H01L 33/32* (2013.01); *H01L 33/46* (2013.01); *H01L 2924/0002* (2013.01); *H01L 2933/0016* (2013.01); *H01L 2933/0066* (2013.01)

(58) Field of Classification Search
IPC ............ H01L 33/40,33/62, 33/32, 33/46, 2933/0016, 2924/0002, 2924/00
See application file for complete search history.

(56) References Cited

U.S. PATENT DOCUMENTS

| | | | |
|---|---|---|---|
| 5,700,718 | A | 12/1997 | McTeer |
| 5,763,010 | A | 6/1998 | Guo et al. |
| 6,016,010 | A | 1/2000 | McTeer |
| 6,022,142 | A | 2/2000 | Hibino |
| 6,348,402 | B1 | 2/2002 | Kawanoue et al. |
| 9,608,185 | B2 * | 3/2017 | Hu .................... H01L 33/40 |
| 2002/0179918 | A1 | 12/2002 | Sung et al. |
| 2011/0291147 | A1 | 12/2011 | Hu et al. |
| 2014/0234996 | A1 | 8/2014 | Hu et al. |

FOREIGN PATENT DOCUMENTS

| | | | |
|---|---|---|---|
| JP | 5136138 | A | 6/1993 |
| JP | 1993136138 | A | 6/1993 |
| JP | 09232632 | A | 9/1997 |
| JP | 1074707 | A | 3/1998 |
| JP | 1084135 | A | 3/1998 |
| JP | 199874707 | A | 3/1998 |
| JP | 199884135 | A | 3/1998 |
| JP | 10125676 | A | 5/1998 |
| JP | 1998125676 | A | 5/1998 |
| JP | 2000040671 | A | 2/2000 |
| JP | 2005064485 | A | 3/2005 |
| JP | 200605933 | A | 3/2006 |
| JP | 2006059933 | A | 3/2006 |
| TW | 201208123 | A | 2/2012 |
| TW | I550907 | B | 9/2016 |
| WO | WO-2011150089 | A2 | 12/2011 |
| WO | WO-2011150089 | A3 | 12/2011 |

OTHER PUBLICATIONS

"Chinese Application Serial No. 201180031071.2, Office Action dated Jan. 14, 2015", W/ English Translation, 15 pgs.
"Chinese Application Serial No. 201180031071.2, Office Action dated Mar. 17, 2016", 4 pgs.
"Chinese Application Serial No. 201180031071.2, Office Action dated Sep. 17, 2015", 7 pgs.
"Chinese Application Serial No. 201180031071.2, Preliminary Amendment filed Aug. 7, 2013", W/ English Claims, 10 pgs.
"Chinese Application Serial No. 201180031071.2, Response filed Nov. 30, 2015 to Office Action dated Sep. 17, 2015", (English Translation of Claims), 7 pgs.
"Definition of material". Merriam-Webster, (Acessed on: May 20, 2015), 5 pgs.
"International Application Serial No. PCT/US2011/037947, International Preliminary Report on Patentability dated Dec. 6, 2012", 9 pgs.
"International Application Serial No. PCT/US2011/037947, Search Report dated Jan. 18, 2012", 4 pgs.
"International Application Serial No. PCT/US2011/037947, Written Opinion dated Jan. 18, 2012", 7 pgs.
"Japanese Application Serial No. 2013-512212, Notice of Rejection dated Aug. 25, 2015", W/ English Translation, 4 pgs.
"Japanese Application Serial No. 2013-512212, Office Action dated Feb. 3, 2015", W/ English Translation, 8 pgs.
"Japanese Application Serial No. 2013-512212, Response filed Apr. 22, 2015 to Office Action dated Feb. 3, 2015", W/ English Amended Claims, 7 pgs.
"Taiwanese Application Serial No. 100118367, Office Action dated Mar. 1, 2016", 9 pgs.
"U.S. Appl. No. 14/261,901, Corrected Notice of Allowance dated Feb. 27, 2017", 5 pgs.
"Chinese Application Serial No. 201180031071.2, Response filed May 26, 2016 to Office Action dated Mar. 17, 2016", (English Translation of Claims), 5 pgs.
"Korean Application Serial No. 10-2012-7033623, Final Office Action dated Jun. 20, 2017", W/ English Translation, 7 pgs.
"Korean Application Serial No. 10-2012-7033623, Office Action dated Mar. 14, 2017", W/ English Translation, 7 pgs.
"Korean Application Serial No. 10-2012-7033623, Response filed May 15, 2017 to Office Actoin dated Mar. 14, 2017", W/ English Claims, 20 pgs.
"Taiwanese Application Serial No. 100118367, Response filed May 31 2016 to Office Action dated Mar. 1, 2016", (English Translation of Claims), 14 pgs.

* cited by examiner

OHMIC CONTACTS FOR SEMICONDUCTOR STRUCTURES

PRIORITY APPLICATION

This application is a continuation of U.S. application Ser. No. 14/261,901, filed Apr. 25, 2014, which is a divisional of U.S. application Ser. No. 12/787,211, filed May 25, 2010, all of which are incorporated herein by reference in their entirety.

BACKGROUND

Semiconductor devices are found in nearly every piece of consumer and commercial electronics made today. Their wide-spanning uses include single discrete devices such as diodes and transistors, as well as integrated circuits which can include many millions of semiconductor devices interconnected on a single semiconductor substrate. The discovery of new materials for use in semiconductor device manufacturing, as well as the development of new semiconductor device manufacturing methods, continues to improve the efficiency of these devices, as well as to expand the already broad range of their practical application.

Light emitting diodes (LEDs) are one example of a semiconductor device widely used in consumer and commercial applications. LEDs contain several semiconductor materials, including up-doped semiconductor material, an n-doped semiconductor material, and a junction between the two materials. As in a normal diode, current flows easily from the p-side, or anode, to the n-side, or cathode, but not in the reverse direction. When a voltage is applied with the correct polarity to the semiconductor structure, the junction is forward-biased, and the charge-carriers, electrons and holes, flow into the junction. When an electron meets a hole as it moves out of the n-doped region and into the junction, it falls to a lower energy level, and releases energy in the form of emitted light. The wavelength of the light emitted, and therefore its color, depends on the band gap energy of the materials forming the junction. Sometimes the n- and p-doped semiconductor material can include multiple layers of different semiconductor materials. Sometimes an active layer is sandwiched between the n-doped semiconductor material and the p-doped semiconductor material, allowing further control over both the wavelength of the photons emitted (e.g. color) and the number of photons emitted (e.g. brightness) when electrons move through the junction. Active layers can themselves include several layers of various semiconductor materials, and sometimes can contain several light emitting layers. LEDs with active layers comprising more than one light emitting layer are commonly called either multi-well (MW) LEDs or multiple quantum well (MQW) LEDs. In contrast, LEDs having a single light emitting layer in the active layer are commonly called either double heterostructure (DH) LEDs, or single quantum well (SQW) LEDs.

In order to utilize a semiconductor structure as a semiconductor device, electricity must be able to get to the structure; e.g., one must be able to apply a voltage across the structure. Since electrical potential and corresponding electrical current is generally transferred through a metallic medium, a connection between the metallic medium and the semiconductor structure is necessary to enable the application of voltage to the structure. Contacts are regions of a semiconductor structure that have been prepared to act as connections between the semiconductor structure and a metallic medium. Contacts that have low resistance, that are stable at various temperatures over time, and also that are stable when subjected to various electrical conditions over time, are critical for the performance and reliability of semiconductor devices. Other desirable properties include smooth surface morphology, simple manufacturing, high production yield, good corrosion resistance, and good adhesion to semiconductors. An ideal contact has no effect on the performance of the semiconductor structure, meaning that it has zero resistance and delivers the required current with no voltage drop between the semiconductor structure and the metal, and also meaning that the relationship between the voltage applied to the contact and the current generated in the structure is perfectly linear. In practice, a contact generally must have some resistance, but contacts that provide an approximately linear voltage-current relationship and that exhibit low resistance are desirable. These are referred to as ohmic contacts.

When two solids are placed in contact with one another, unless each solid has the same electrochemical potential, also called the work function, electrons will flow from one solid to the other until equilibrium is reached, forming a potential between the two solids, called the contact potential. A contact potential can give insulating properties to the connection between the two solids, and is the underlying cause of phenomena such as rectification in diodes. The contact potential causes the voltage-current relationship to be non-linear, and thus the connection between the two solids departs from ideal ohmic contact properties. In general, to create ohmic contacts with the lowest resistances and with the most linear and symmetric voltage-current relationship, materials with a work function near to the work function of the particular semiconductor material on which the ohmic contact is to be formed are sought.

Traditional methods of fabricating ohmic contacts on semiconductor structures, including structures that are to become LEDs, involve deposition of one or more various materials on the structure, such that the one or more materials only touch a specific part of the semiconductor structure. Generally, the materials as deposited on the semiconductor do not yet form an ohmic contact, because relationship between the work function of each material is such that undesirable contact potentials are formed. Therefore, the deposition step is followed by an annealing process to chemically alter the materials, which can correspondingly alter their work functions. During the anneal, diffusion of the atoms of the deposited layers and the contiguous portion of the semiconductor structure occurs, causing the materials to mix to varying degrees, essentially making the deposited layers part of the semiconductor structure while still allowing them to retain their basic physical shape. By allowing the relocation of atoms, annealing enables the formation of new chemical species with different properties than the originally deposited layers or the contiguous portion of the structure, and preferably results in the newly formed portion of the semiconductor structure having the desired ohmic contact properties. While annealing is generally essential for formation of an ohmic contact, high temperatures can introduce thermal defects into the semiconductor structure, leading to negative effects in the resulting semiconductor device, such as poor performance and poor operating lifespan. Additionally, high temperatures can cause undesirable changes in the surface characteristics (surface morphology) of the contact, such as beading and mottling, tending to make an electrical connection to the ohmic contact more difficult and less efficient. The negative effects of high temperature are compounded by a longer exposure to those temperatures. Therefore, compositions and methods for formation of ohmic contacts on semiconductor structures that can handle shorter anneals and that don't require high temperature anneals are sought.

For example, a common semiconductor used in LED semiconductor devices, and in other semiconductor devices, is gallium nitride (GaN), frequently found as layers of n-doped and/or p-doped material in the semiconductor structure. An ohmic contact is often sought to be formed with a specific layer of GaN, for example n-doped GaN (n-GaN). A stable metal-n-GaN system is imperative for the achievement of n-GaN-containing semiconductor devices, including LEDs. Contacts made by depositing titanium (Ti) followed by aluminum (Al) on the semiconductor structure are the most popular in n-GaN-containing semiconductor devices (Ti/Al-bilayer). However, the Ti/Al-bilayer system is easily prone to converting to an undesirable high-resistance contact after thermal annealing at an intermediate temperature range. This could be due to the formation of an aluminum oxide ($Al_2O_3$) on the Al, leading to an increase in the contact resistance. This change can be due to the formation of titanium nitride (TiN) during the annealing process. The Ti/Al-bilayer system can convent to an ohmic contact and exhibit a specific contact resistance that can be about $10^{-5} \sim 10^{-6}$ $\Omega cm^2$ when annealed at higher temperatures. However, annealing at high temperatures can cause degradation in semiconductor device performance and reliability because Al has a low melting point (~660 degrees C.) and tends to ball up during annealing. Thus, the surface morphology of most Ti/Al-bilayer based contacts is quite rough. In addition, application of high temperature to the semiconductor structure introduces thermal defects, which also can cause degradation in the performance of the semiconductor device.

BRIEF DESCRIPTION OF THE DRAWINGS

In the drawings, which are not necessarily drawn to scale, like numerals can describe substantially similar components throughout the several views. The figures illustrate generally, by way of example, but not by way of limitation, various embodiments and examples discussed in the present document.

DETAILED DESCRIPTION

Figure 1:
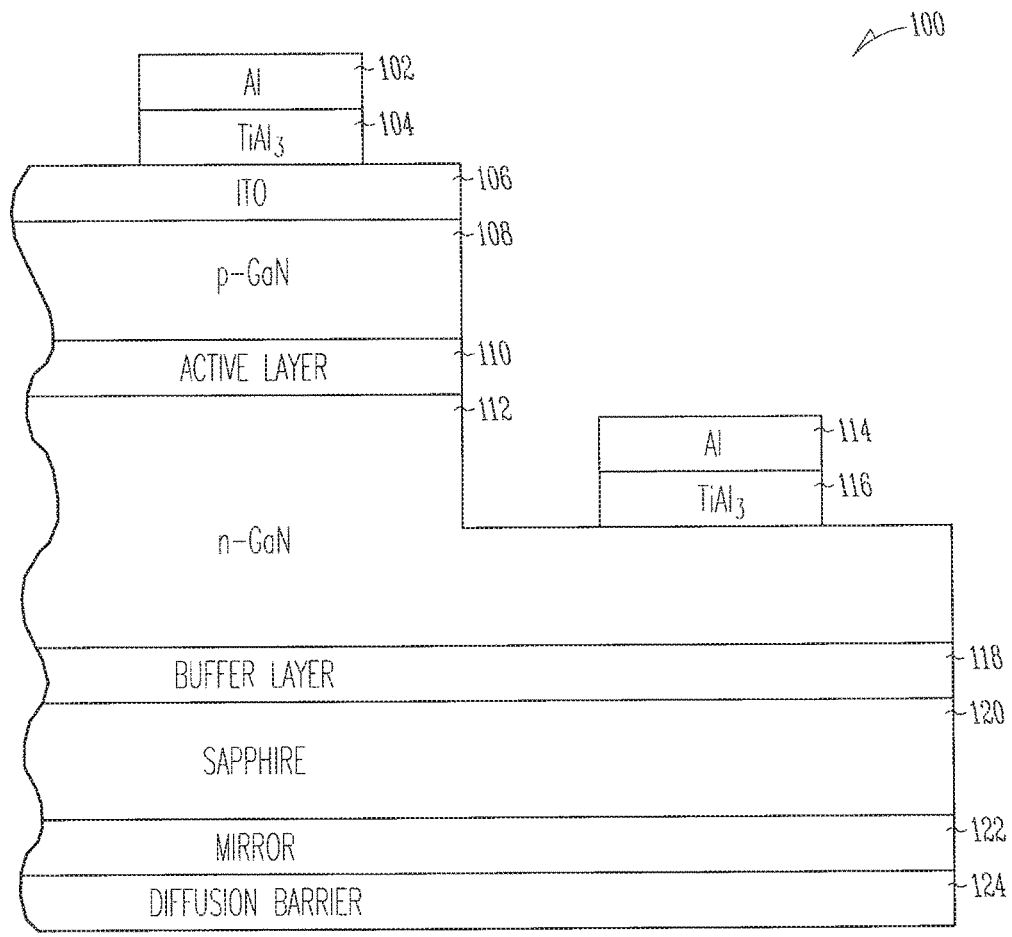
FIG. 1 illustrates a two-dimensional end-on view of a semiconductor structure 100 that is to become multiple LED semiconductor devices.

The present invention provides a composition for formation of an ohmic contact on a semiconductor structure. The composition includes a $TiAl_xN_y$ material. The $TiAl_xN_y$ material is at least partially contiguous with the semiconductor structure. The semiconductor structure includes at least one semiconductor material. The variables x and y do no simultaneously equal zero. When the variable y equals zero, x does not equal one.

The present invention provides a method for formation of an ohmic contact on a semiconductor structure. The method includes providing a semiconductor structure. The semiconductor structure includes an n-doped GaN material. The method also includes depositing a $TiAl_xN_y$ material. The $TiAl_xN_y$ material is deposited contiguous to at least part of the n-doped GaN material. The $TiAl_xN_y$ material is approximately 200 to 2000 angstroms thick. The variables x and y do not simultaneously equal zero. When the variable y equals zero, the variable x does not equal one. The method also includes annealing the semiconductor structure and the $TiAl_xN_y$ material. The annealing takes place at or less than approximately 660 to 880 degrees C. The annealing takes place for a duration of approximately 30 to 60 seconds.

The present invention provides a method for formation of an ohmic contact on a semiconductor structure. The method includes providing a semiconductor structure. The semiconductor structure includes an n-doped GaN material. The method includes depositing a $TiAl_xN_y$ material. The $TiAl_xN_y$ material is deposited contiguous to at least part of the n-doped GaN material. the $TiAl_xN_y$ material is approximately 50 to 200 angstroms thick. The variables x and y do not simultaneously equal zero. When the variable y equals zero, the variable x does not equal one. The method also includes depositing an aluminum material. The aluminum material is deposited contiguous to at least part of the $TiAl_xN_y$ material. The aluminum material is deposited such that the $TiAl_x$ material is between the aluminum material and the n-doped GaN material. The aluminum material is approximately 1000 angstroms thick. The method also includes annealing the semiconductor structure and the $TiAl_xN_y$ material and the aluminum material. The annealing takes place at or less than approximately 660 degrees C. The annealing takes place for a duration of approximately 30 to 60 seconds.

The present invention provides in various embodiments a composition and method for formation of ohmic contacts on a semiconductor structure. In various embodiments, the composition includes $TiAl_xN_y$ material. The $TiAl_xN_y$ material is at least partially contiguous with the semiconductor structure. The $TiAl_xN_y$ can be $TiAl_3$. The composition can include aluminum. The aluminum can be contiguous to at least part of the $TiAl_xN_y$, such that the $TiAl_xN_y$ is between the aluminum and the semiconductor structure. The method includes annealing the composition to form an ohmic contact on the semiconductor structure.

The invention relates to a composition and method for formation of an ohmic contact on a semiconductor structure. When describing the composition and the method, the following terms have the following meanings, unless otherwise indicated.

As used herein, the term "contiguity" refers to an area of physical touching or contacting.

As used herein, the term "contiguous" refers to physical touching or in contact with, to any degree.

As used herein, the term "ohmic contact" refers to a contact that provides an approximately linear voltage-current relationship and that exhibits low resistance. An ohmic contact can be used for connecting an electrical potential to a semiconductor structure or semiconductor device. An ohmic contact can be considered to be on a semiconductor structure, and it can also be considered to be part of a semiconductor structure.

As used herein, the term "semiconductor device" refers to a semiconductor structure that is ready for its intended use, such as ready for use as an electronics component, and also such as ready to function as a component in an integrated circuit. The term can refer to, but is not limited to, a state of manufacturing wherein all layers of semiconductor material necessary for the intended operation of the semiconductor device are in place and have been annealed as necessary, necessary passivation has been performed, and the necessary contacts have been formed on the semiconductor structure to enable the application of a desired electrical potential across the structure. The term can refer to multiple semiconductor devices, and to multiple semiconductor structures ready for their intended use.

As used herein, the term "semiconductor material" refers to a material that includes but need not be exclusively a chemical compound or chemical compounds, said chemical compound or compounds when pure having an electrical conductivity between that of a conductor and an insulator. Semiconductor materials can be undoped, n-doped, or p-doped, and include but are not limited to, in their pre- or post-doped state, at least one of: GaN, InGaN, AlGaN, AlGaInN, InN, GaAs, AlGaAs, AlGaAs, GaAsP, AlGaInP, GaP, AlGaP, ZnSe, SiC, Si, diamond, BN, AlN, MgO, SiO, ZnO, $LiAlO_2$, SiC, Ge, InAs, InAt, InP, C, Ge, SiGe, AlSb, AlAs, AlP, BP, BAs, GaSb, InSb, $Al_zGa_{1-z}As$, InGaAs, $In_zGa_{1-z}As$, InGaP, AlInAs, AlInSb, GaAsN, AlGaP, AlGaP, InAsSb, InGaSb, AlGaAsP, AlInAsP, AlGaAsN, InGaAsN, InAlAsN, GaAlAsN, GaAsSbN, GaInNAsSb, or GaInAsSbP.

As used herein, the term "semiconductor structure" refers to but is not limited to at least one layer of semiconductor material, but can also refer to multiple layers of semiconductor material, that is or are to become a semiconductor device. The state of becoming a semiconductor device can occur once a manufacturing process is complete. The term "semiconductor structure" can also refer to one or more semiconductor devices at an intermediate stage of manufacture. The term can refer to but is not limited to a layer or layers of semiconductor material that is or are to become multiple semiconductor devices. The term also encompasses a structure or structures that is or are to become a semiconductor device when the structure or structures include at least one layer of semiconductor material, or multiple layers of semiconductor material, and the structure or structures also include layers of other materials contiguous with at least one layer of semiconductor material for the purpose of formation of an ohmic contact.

As used herein, the chemical formula "$TiAl_xN_y$" refers to but is not limited to a compound or compounds with a molar ratio of titanium (Ti) to aluminum (Al) to nitrogen (N) of 1:x:y, where x and y can each independently equal zero. The chemical formula can also additionally or alternatively refer to, but is not limited to, a mixture of the elements titanium, aluminum, and nitrogen with a molar ratio of Ti to Al to N of 1:x:y, wherein the atoms of titanium, aluminum, and nitrogen are not bonded together as a compound or compounds with a chemical formula of $TiAl_xN_y$, but rather exist as a homogenous, semi-homogenous, or heterogenous mixture; in this case, the atoms of titanium, aluminum, and/or nitrogen can be but are not necessarily chemically bonded together as a compound or compounds, the compound or compounds of which are not necessarily the same, the compound or compounds of which can but do not necessarily contain all three of these elements in the same proportions, the compound or compounds of which can be but are not necessarily intentionally formed, and the compound or compounds of which can but do not necessarily exist for transient or permanent duration. In some embodiments, x and additionally or alternatively y are not of a consistent value throughout the $TiAl_xN_y$ material. Thus, in some embodiments, in some locations of the $TiAl_xN_y$ material versus other locations of the $TiAl_xN_y$ material, x or y can have values that fall within ranges rather than have values that are exact. In some embodiments for which values of x or y are specified, the specification of value not only encompasses embodiments where x or y are consistently equal to the specified values throughout a material, but also encompasses embodiments where the value of x or y averages to about the specified values as the composition of the $TiAl_xN_y$ material is sampled throughout its entirety. Correspondingly, in embodiments for which a specific pair of values for x and y are forbidden, embodiments are not forbidden in which samples of $TiAl_xN_y$ with the forbidden pair of values can be found within a $TiAl_xN_y$ material, but rather embodiments are only forbidden for which a $TiAl_xN_y$ material has the forbidden pair of values for x and y throughout the material consistently, or for which a $TiAl_xN_y$ material has the forbidden pair of values of x and y as average values of x and y as the composition of the $TiAl_xN_y$ material is sampled throughout its entirety.

Reference will now be made in detail to certain embodiments of the invention, examples of which are illustrated in the accompanying structures and formulas. While the invention will be described in conjunction with the enumerated claims, it will be understood that they are not intended to limit the invention to those claims. On the contrary, the invention is intended to cover all alternatives, modifications, and equivalents, which can be included within the scope of the invention as defined by the claims.

References in the specification to "one embodiment," "an embodiment," "an example embodiment," etc., indicate that the embodiment described can include a particular feature, structure, or characteristic, but every embodiment can not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In some embodiments the present invention provides a composition for formation of an ohmic contact on a semiconductor structure, comprising $TiAl_xN_y$ material at least partially contiguous with the semiconductor structure, wherein x and y do not simultaneously equal zero. Some embodiments of the present invention can be semiconductor structures that include at least one semiconductor material. Some embodiments of the present invention can be semiconductor structures that are to become one or more semiconductor devices for use in circuits, including integrated circuits, and for any application for a semiconductor device. In some embodiments of the present invention, the types of semiconductor devices which the claimed semiconductor structures are to become unlimited, and include but are not limited to: any transistor or transistors including MOS-FETs (metal oxide semiconductor field effect transistors), any MOS device, any diode (a device which, in general, only conducts current in one direction) including all types of LEDs, integrated circuits (miniaturized electronic circuits containing multiple semiconductor devices), microprocessors, and memory including RAM (random access memory) and ROM (read only memory) memory.

In some embodiments of the present invention, the $TiAl_xN_y$ and alternatively or additionally the semiconductor structure can contain some chemical impurities, such that in those embodiments the $TiAl_xN_y$ can or can not contain some chemical elements that are not Ti, Al, or N, and the semiconductor structure can or can not contain some chemical elements that are not semiconductor materials, and the aluminum (if present) can or can not contain some chemical elements that are not aluminum. In these embodiments, the presence of the impurities need not be specified in order to refer to the $TiAl_xN_y$, or to the semiconductor material that is at least part of the semiconductor structure or to the aluminum (if present). In these embodiments, the level of impurities present is not sufficient to prevent the intended formation of an ohmic contact or contacts, nor is it sufficient to prevent the operation of the semiconductor device or devices into which the semiconductor structure is to be formed. In some embodiments, the presence of certain compounds in the semiconductor material that can be called chemical impurities is intended and sometimes can cause the semiconductor material to be doped, in which cases generally the presence of impurities enables the intended operation of the semiconductor device.

Some embodiments of the present invention include but are not limited to compositions and methods for the formation of multiple contacts, and are not restricted to compositions and methods for the formation of one contact or for the formation of one contact at a time. Thus, some embodiments of the present invention include compositions and methods for the formation of multiple contacts, and additionally embodiments of the present invention encompass compositions and methods for the formation of multiple contacts at one time.

Figure 2:
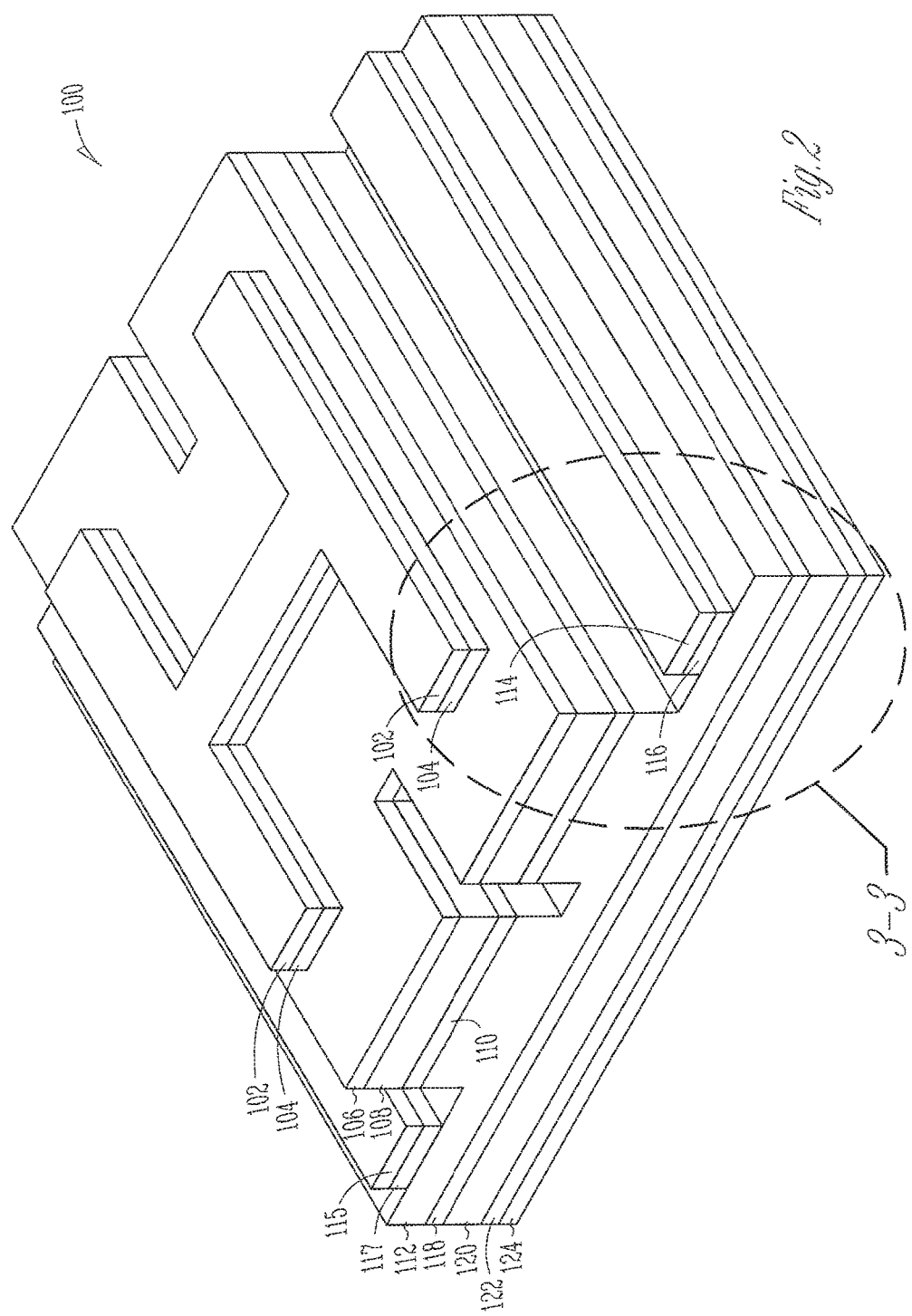
FIG. 2 illustrates a three-dimensional view of a semiconductor structure 100 that is to become multiple LED semiconductor devices.
Figure 3:
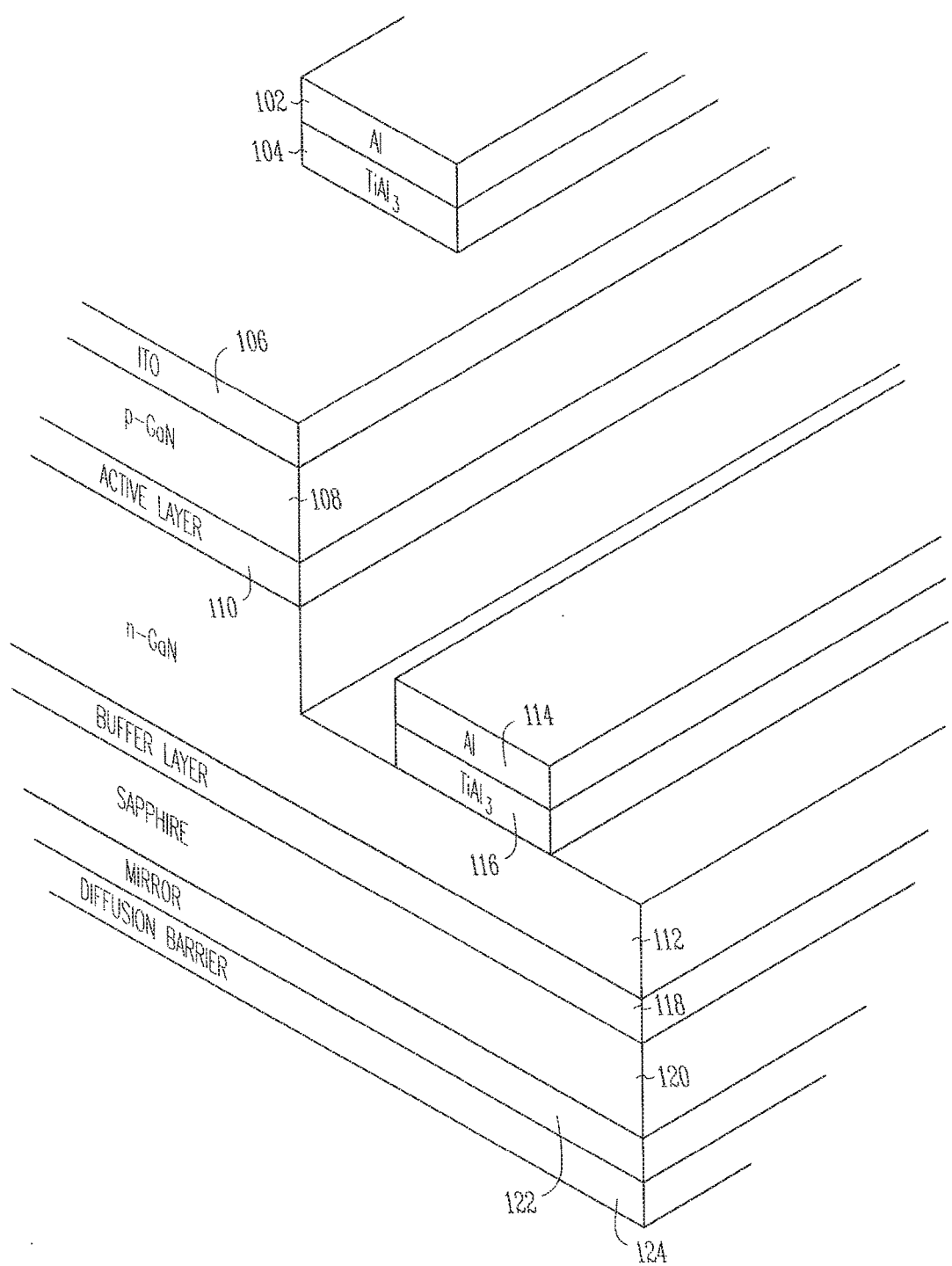
FIG. 3 illustrates a three-dimensional close-up view of a semiconductor structure 100 that is to become multiple LED semiconductor devices.

One embodiment of the present invention includes compositions and methods for the formation of one or more ohmic contacts that extend across a semiconductor structure, which can then, after annealing, and sometimes after other steps, be cut or chopped or broken or sliced into many separate semiconductor structures or semiconductor devices. In FIGS. 1, 2, and 3 are shown a semiconductor structure 100 which, after manufacturing is completed, is to be multiple LED semiconductor devices. The semiconductor structure depicted by these figures is simplified; there can be texturing or variation in the thickness or shapes of the materials and structure in an actual embodiment which are not depicted in FIGS. 1-3. FIG. 1 shows a two dimensional cutaway of the semiconductor structure 100, FIG. 2 shows a three-dimensional view of the semiconductor structure 100, and FIG. 3 shows a three-dimensional close-up of the semiconductor structure 100. In this specific embodiment, the semiconductor structure includes a diffusion barrier 124, followed by a mirror 122, a sapphire 120, and a buffer 118. On buffer 118 is n-doped GaN 112, followed by active area 110, p-doped GaN 108, and indium tin oxide (ITO) 106. At least partially contiguous with the semiconductor structure 100, specifically at least partially contiguous with the n-GaN 112, is $TiAl_3$ 116. At least partially contiguous with $TiAl_3$ 116 is aluminum 114. At least partially contiguous with the semiconductor structure 100, specifically at least partiality contiguous with no 106, is $TiAl_3$ 104. At least partially contiguous with the $TiAl_3$ is aluminum 102. Visible in FIG. 2 is $TiAl_3$ 117, at least partially contiguous with semiconductor structure 100, specifically at least partially contiguous with n-GaN 112. At least partially contiguous with $TiAl_3$ 117 is Al 115. After annealing, which changes the chemical composition of the materials, the semiconductor structure 100 can then include three separate broad ohmic contacts in the locations where the Al and $TiAl_3$ had been located, specifically 115 and 117, 102 and 104, and 114 and 116, and including the portions of n-GaN, which can also be chemically modified by the anneal. After annealing, and sometimes after other steps, the semiconductor structure 100 is then cut or chopped or broken or sliced into many separate semiconductor structures or devices, for example singulated LEDs, each containing multiple ohmic contacts.

Some embodiments of the present invention encompass any degree of contiguity between the semiconductor structure and the $TiAl_xN_y$, including contiguity of only a few atoms, or contiguity of the majority of the surfaces of semiconductor structure and the $TiAl_xN_y$. Some embodiments of the present invention encompass contiguity that is between the $TiAl_xN_y$ and one specific portion of semiconductor material that is at least part of the semiconductor structure; some embodiments of the present invention additionally or alternatively encompass contiguity between the $TiAl_xN_y$ and multiple specific portions of semiconductor material that is at least part of the semiconductor structure.

One embodiment of the invention is a composition for formation of an ohmic contact on a semiconductor structure, comprising a $TiAl_xN_y$ material at least partially contiguous with the semiconductor structure, wherein x and y do not simultaneously equal zero. In some embodiments, when y equals zero, x does not equal one. In some embodiments, the contiguity between the $TiAl_xN_y$ material and the semiconductor structure includes at least partial contiguity with n-doped GaN. In some embodiments, the contiguity between the $TiAl_xN_y$ material and the semiconductor structure includes at least partial contiguity with a p-doped GaN. In some embodiments, the contiguity between the $TiAl_xN_y$ material and the semiconductor structure includes at least partial contiguity with at least one portion of the semiconductor structure. In some embodiments of the present invention, the contiguity between the $TiAl_xN_y$ material and the semiconductor structure includes at least partial contiguity with more than one portion of the semiconductor structure.

An embodiment of the invention is a composition for formation of an ohmic contact on a semiconductor structure, comprising a $TiAl_xN_y$ material at least partially contiguous with the semiconductor structure, wherein the contiguity between the $TiAl_xN_y$ material and the semiconductor structure includes at least partial contiguity with at least one portion of semiconductor material which can be undoped, n-doped, or p-doped, wherein the undoped, n-doped, or p-doped material includes in either or both its pre- or post-doped state at least one of: GaN, In GaN, AlGaN, AlGaInN, InN, GaAs, AlGaAs, AlGaAs, GaAsP, AlGaInP, GaP, AlGaP, ZnSe, SiC, Si, diamond, BN, AlN, MgO, SiO, ZnO, $LiAlO_2$, SiC, Ge, InAs, InAt, InP, C, Ge, SiGe, AlSb, AlAs, AlP, BP, BAs, GaSb, InSb, $Al_zGa_{1-z}As$, InGaAs, $In_zGa_{1-z}As$, InGaP, AlInAs, AlInSb, GaAsN, AlGaP, AlGaP, InAsSb, InGaSb, AlGaAsP, AlInAsP, AlGaAsN, InGaAsN, InAlAsN, GaAlAsN, GaAsSbN, GaInNAsSb, or GaInAsSbP.

Another embodiment of the invention is a composition for formation of an ohmic contact on a semiconductor structure, comprising $TiAl_xN_y$ material at least partially contiguous with the semiconductor structure. In some embodiments, the $TiAl_xN_y$ material is at least partially contiguous with the semiconductor structure prior to or during at least part of an annealing process. In some embodiments, the $TiAl_xN_y$ material is added using at least one of the following: atomic layer deposition, physical vapor deposition (PVD), or chemical vapor deposition (CVD).

In one embodiment, the present invention provides a composition for formation of an ohmic contact on a semiconductor structure, comprising a $TiAl_xN_y$ material at least partially contiguous with the semiconductor structure, wherein x is equal to about 3 and y is equal to about zero. In another embodiment, the $TiAl_3$ material is between approximately 5 and 4000 angstroms thick. In another embodiment, the $TiAl_3$ material is between approximately 50 and 4000 angstroms thick. In another embodiment, the $TiAl_3$ material is between approximately 50 and 2000 angstroms thick. In another embodiment, the $TiAl_3$ material is between approximately 100 and 1000 angstroms thick. In another embodiment, the $TiAl_3$ is material approximately 200 angstroms thick. In another embodiment, the $TiAl_3$ material is approximately 150 angstroms thick. In another embodiment, the $TiAl_3$ material is approximately 100 angstroms thick.

In one embodiment, the present invention provides a composition for formation of an ohmic contact on a semiconductor structure, comprising $TiAl_xN_y$ material at least partially contiguous with the semiconductor structure, wherein the composition further includes an aluminum material, wherein the aluminum material is contiguous to at least part of the $TiAl_xN_y$ material. In a related embodiment, the $TiAl_xN_y$ is between the semiconductor structure and the aluminum. In another related embodiment, the aluminum is added using at least one of the following: atomic layer deposition, physical vapor deposition (PVD), or chemical vapor deposition (CVD). In another related embodiment, the aluminum is between about 5 and 4000 angstroms thick. In another related embodiment, the aluminum is between about 250 and 2000 angstroms thick. In another related embodiment, the aluminum is between about 750 and 1250 angstroms thick. In another related embodiment, the aluminum is approximately 1000 angstroms thick.

In some embodiments the present invention provides a composition for formation of an ohmic contact on a semiconductor structure, comprising $TiAl_xN_y$ material at least partially contiguous with the semiconductor structure, wherein the $TiAl_xN_y$ material is between about 5 and 4000 angstroms thick. In another embodiment, the $TiAl_xN_y$ material is between approximately 50 and 4000 angstroms thick. In another embodiment, the $TiAl_xN_y$ is between approximately 50 and 2000 angstroms thick. In another embodiment, the $TiAl_xN_y$ material is between approximately 100 and 1000 angstroms thick. In another embodiment, the $TiAl_xN_y$ material is approximately 200 angstroms thick. In another embodiment, the $TiAl_xN_y$ material is approximately 150 angstroms thick. In another embodiment, the $TiAl_xN_y$ material is approximately 100 angstroms thick Another embodiment of the present invention provides a composition for formation of an ohmic contact on a semiconductor structure, comprising a $TiAl_xN_y$ material at least partially contiguous with the semiconductor structure, wherein x is between about zero and 10. In another embodiment, x is between about 1 and 10. In another embodiment, x is between about zero and 5. In another embodiment, x is between about zero and 1. In another embodiment, x is between zero and 0.5.

In some embodiments the present invention provides a composition for formation of an ohmic contact on a semiconductor structure, comprising a $TiAl_xN_y$ material at least partially contiguous with the semiconductor structure, wherein y is between about zero and 10. In another embodiment, y is between about zero and 5. In another embodiment, y is between about zero and 1. In another embodiment, y is between about zero and 0.5.

Embodiments of the present invention include a method for formation of an ohmic contact on a semiconductor structure, comprising the step of annealing a composition for formation of an ohmic contact on a semiconductor structure, the composition comprising a $TiAl_xN_y$ material at least partially contiguous with the semiconductor structure. In some embodiments, the semiconductor structure can be annealed at a temperature of less than 500 degrees C. to 1500 degrees C.; at less than about 1000 to 1500 degrees C.; at about 800 degrees C.; at less than about 660 degrees C.; or at less than about 500 degrees C.

Embodiments of the present invention include a method for formation of an ohmic contact on a semiconductor structure, comprising the step of annealing a composition for formation of an ohmic contact on a semiconductor structure, the composition comprising a $TiAl_xN_y$ material at least partially contiguous with the semiconductor structure. In some embodiments, the semiconductor structure can be annealed for approximately 0.001 to 10 minutes; for approximately 5 to 10 minutes; for approximately 1 to 5 minutes; for approximately 1 minute; for approximately 30 to 60 seconds; or for approximately 0.001 to 1 minute.

In some embodiments the present invention provides a method for formation of an ohmic contact on a semiconductor structure, comprising the steps of: providing a semiconductor structure, wherein the semiconductor structure includes an n-doped GaN material; depositing a $TiAl_xN_y$ material contiguous to at least part of the n-doped GaN, wherein x and y do not simultaneously equal zero; and, annealing the semiconductor structure and the $TiAl_xN_y$. In a related embodiment, x is equal to about 3 and y is equal to about zero. In another related embodiment, the $TiAl_xN_y$ material is about 200-2000 angstroms thick. In another related embodiment, the $TiAl_xN_y$ material is about 200 angstroms thick. In another related embodiment, the annealing process takes place at about 800 degrees C. In another related embodiment, the annealing process takes place at less than 660 degrees C. In another related embodiment, the annealing process takes place for approximately 0.1 to 10 minutes. In another related embodiment, the annealing process takes place for approximately 30 to 60 seconds.

Another embodiment of the present invention provides a method for formation of an ohmic contact on a semiconductor structure, comprising the steps of: providing a semiconductor structure, wherein the semiconductor structure includes an n-doped GaN material, depositing a $TiAl_xN_y$ material contiguous to at least part of the n-doped GaN, wherein x and y do not simultaneously equal zero, depositing Al contiguous to at least part of the $TiAl_xN_y$, such that the $TiAl_xN_y$ is between the Al and the n-doped GaN, and annealing the semiconductor structure and the $TiAl_xN_y$ material and the Al material. In a related embodiment, x is equal to about 3 and y is equal to about zero. In another related embodiment, the $TiAl_xN_y$ material is about 50-200 angstroms thick and the Al material is about 1000 angstroms thick. In another related embodiment, the annealing process takes place at less than 660 degrees C. In another related embodiment, the annealing process takes place for approximately 0.1 to 10 minutes. In another related embodiment, the annealing process takes place for approximately 30 to 60 seconds.

Various embodiments of the present invention provide a method of manufacturing an LED comprising: use of a composition for formation of an ohmic contact on a semiconductor structure, comprising a $TiAl_xN_y$ material at least partially contiguous with the semiconductor structure, wherein x and y do not simultaneously equal zero; or comprising a method for formation of an ohmic contact on a semiconductor structure, comprising the step of annealing a composition for formation of an ohmic contact on a semiconductor structure, comprising a $TiAl_xN_y$ material at least partially contiguous with the semiconductor structure, wherein x and y do not simultaneously equal zero; or comprising a method for formation of an ohmic contact on a semiconductor structure, comprising the steps of providing a semiconductor structure, wherein the semiconductor structure includes an n-doped GaN material, depositing a $TiAl_xN_y$ material contiguous to at least part of the n-doped GaN, wherein x and y do not simultaneously equal zero, and annealing the semiconductor structure and $TiAl_xN_y$ material; or comprising a method for formation of an ohmic contact on a semiconductor structure comprising the steps of providing a semiconductor structure, wherein the semiconductor structure includes an n-doped GaN material, depositing a $TiAl_xN_y$ material contiguous to at least part of the n-doped GaN, wherein x and y do not simultaneously equal zero; depositing aluminum material contiguous to at least part of the $TiAl_xN_y$, such that the $TiAl_xN_y$ is between the aluminum and the n-doped GaN; and, annealing the semiconductor structure and the $TiAl_xN_y$ material and the aluminum material.

Various embodiments of the present invention provide a composition or product formed by any one of the methods comprising: a method for formation of an ohmic contact on a semiconductor structure, comprising the step of annealing a composition for formation of an ohmic contact on a semiconductor structure, comprising a $TiAl_xN_y$ material at least partially contiguous with the semiconductor structure, wherein x and y do not simultaneously equal zero; or comprising a method for formation of an ohmic contact on a semiconductor structure, comprising the steps of providing a semiconductor structure, wherein the semiconductor structure includes an n-doped GaN material, depositing a $TiAl_xN_y$ material contiguous to at least part of the n-doped GaN material, wherein x and y do not simultaneously equal zero, and annealing the semiconductor structure and the $TiAl_xN_y$ material; or comprising a method for formation of an ohmic contact on a semiconductor structure comprising the steps of providing a semiconductor structure, wherein the semiconductor structure includes an n-doped GaN material, depositing $TiAl_xN_y$ contiguous to at least part of the n-doped GaN, wherein x and y do not simultaneously equal zero; depositing an aluminum material contiguous to at least part of the $TiAl_xN_y$, such that the $TiAl_xN_y$ is between the aluminum and the n-doped GaN; and, annealing the semiconductor structure and the $TiAl_xN_y$ material and the aluminum material.

Various embodiments of the present invention provide an LED comprising: a composition for formation of an ohmic contact on a semiconductor structure, comprising a $TiAl_xN_y$ material at least partially contiguous with the semiconductor structure, wherein x and y do not simultaneously equal zero; or an LED prepared by any one of the methods comprising: a method for formation of an ohmic contact on a semiconductor structure, comprising the step of annealing a composition for formation of an ohmic contact on a semiconductor structure, comprising a $TiAl_xN_y$ material at least partially contiguous with the semiconductor structure, wherein x and y do not simultaneously equal zero; or comprising a method for formation of an ohmic contact on a semiconductor structure, comprising the steps of providing a semiconductor structure, wherein the semiconductor structure includes an n-doped GaN material, depositing a $TiAl_xN_y$ material contiguous to at least part of the n-doped GaN, wherein x and y do not simultaneously equal zero, and annealing the semiconductor structure and the $TiAl_xN_y$ material; or comprising a method for formation of an ohmic contact on a semiconductor structure comprising the steps of providing a semiconductor structure, wherein the semiconductor structure includes an n-doped GaN material, depositing a $TiAl_xN_y$ material contiguous to at least part of the n-doped GaN material, wherein x and y do not simultaneously equal zero; depositing an aluminum material contiguous to at least part of the $TiAl_xN_y$, such that the $TiAl_xN_y$ is between the aluminum and the n-doped GaN and, annealing the semiconductor structure and the $TiAl_xN_y$ material and the aluminum material.

FIGS. 5-9 illustrate compositions and methods of forming ohmic contacts, FIGS. 6-9 illustrate specific embodiments of the present invention, not intending to limit the invention in any way. The two dimensional cutaways shown in FIGS. 5-9 are intended to show the relevant junctions between materials, and can not represent the entirety of the semiconductor material in the full structure, thus the materials could be different shapes or sizes in the full structure than the shapes or sizes as they are shown as in FIGS. 5-9.

Figure 4:
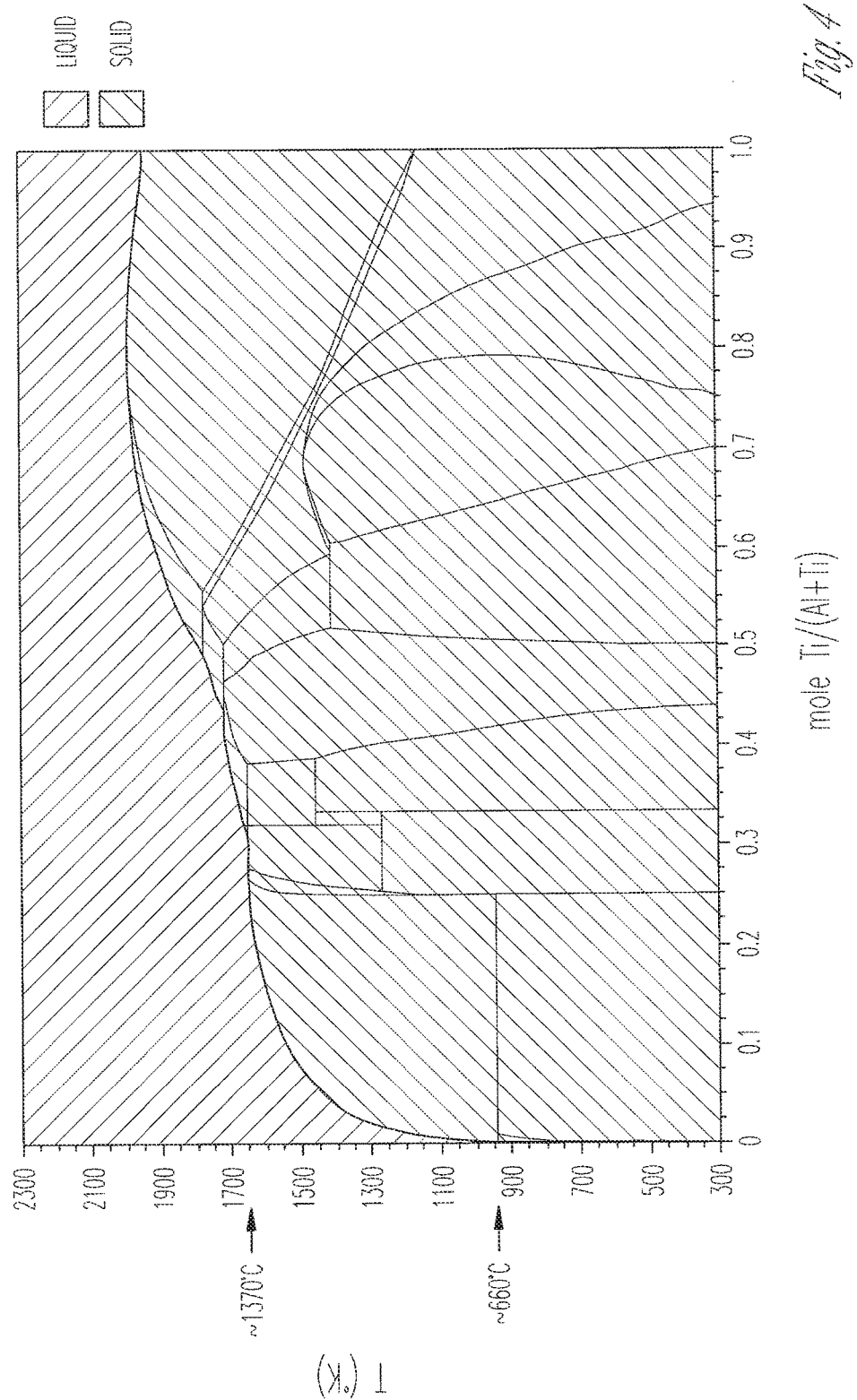
FIG. 4 illustrates an Al—Ti binary alloy phase diagram.
Figure 5:
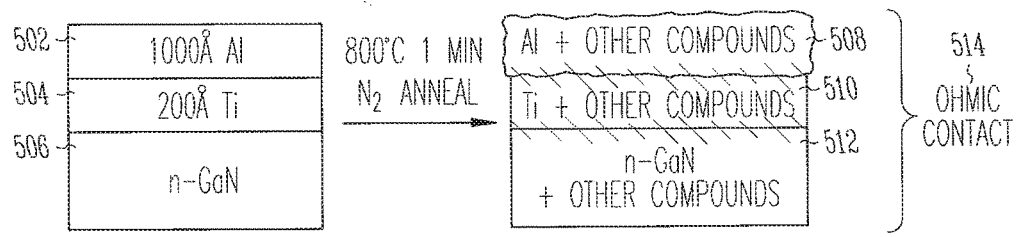
FIG. 5 illustrates a method of forming an ohmic contact on a semiconductor structure using a Ti material followed by an Al material, followed by annealing.

An example of a disadvantageous method of forming ohmic contacts on n-doped GaN (n-GaN) semiconductor structures which is not an embodiment of the present invention is shown in FIG. 5, and includes formation of a titanium material 504 approximately 200 angstroms thick on a semiconductor structure comprising an n-GaN 506 material, followed by the formation of aluminum material 502 approximately 1000 angstroms thick at least partially contiguous with the titanium material 504. Note that in FIG. 5, and likewise in FIGS. 6-9, the n-GaN material depicted can be a cutaway of a larger n-GaN material, not shown. The structure is then annealed for 1 minute at 800 degrees C., which is adequate time and temperature to permit formation of an ohmic contact 514. In the ohmic contact 514, the materials have undergone some chemical changes, resulting from atoms diffusing through the materials and generating new compounds. Thus, in the ohmic contact 514, the aluminum material 508 can include other compounds not originally present in material 502, the titanium material 510 can include other compounds not originally present in material 504, and the n-GaN material 512 near to titanium material 510 can include other compounds not originally present in material 506. During the annealing process, due to the titanium material 504 being between the n-GaN material 506 and the aluminum material 502, the aluminum atoms need to diffuse through the titanium material 504 to reach the n-GaN surface, allowing the formation of chemical species that can give the contact its ohmic properties; diffusion through a material requires higher annealing temperatures and additionally or alternatively more extended annealing times. A disadvantage of this method includes the use of high temperature, which can introduce thermal defects into the semiconductor structure. Another disadvantage of this method includes the use of aluminum in its elemental state, which melts at approximately 660 degrees C. (see FIG. 4), meaning that it melts during the high temperature annealing process, which causes it to bead and mottle, which causes undesirable surface morphology on the resulting ohmic contact. Another disadvantage of this method includes the amount of time the annealing process requires, which multiplies the negative effects of high heat on the semiconductor structure, and additionally increases the negative effects of high heat on elemental aluminum, e.g. melting and beading.

Some embodiments of the present invention provide advantages over known compositions and methods for the formation of ohmic contacts on semiconductor structures, including semiconductor structures that are to become LED semiconductor devices. Advantages can include, but are not limited to, the use of lower heat during the annealing process, the use of a shorter annealing process, and the use of materials that are more resilient to a high temperature annealing process.

Figure 6:
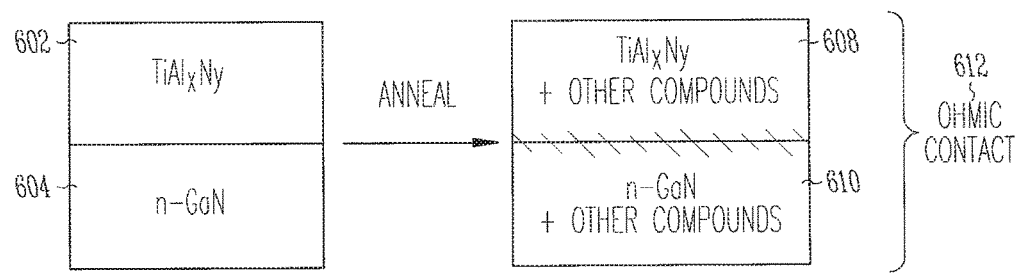
FIG. 6 illustrates a specific embodiment of the present invention, a composition and method for forming an ohmic contact on a semiconductor structure comprising a $TiAl_xN_y$ material followed by annealing.

An embodiment of the present invention is shown in FIG. 6 which provides a composition for formation of ohmic contacts on a semiconductor structure, the composition comprising a $TiAl_xN_y$ material 602 at least partially contiguous with the semiconductor structure, comprising a n-GaN material 604. After an annealing process, an ohmic contact 612 is formed. In the ohmic contact 612, the materials have undergone some chemical changes, resulting from atoms diffusing through the materials and generating new compounds. Thus, in the ohmic contact 612, the $TiAl_xN_y$ material 608 can include other compounds not originally present in material 602, and the n-GaN material 610 near to $TiAl_xN_y$ material 608 can include other compounds not originally present in material 604. Some compositions of $TiAl_xN_y$ can have melting points greater than 800 degrees C. (see FIG. 4 for nonlimiting examples when y equals zero). Therefore, the semiconductor structure can be annealed at 800 degrees C. without the disadvantage of using a material for formation of the ohmic contact that melts at the annealing temperature, thus improving the surface morphology of the resulting ohmic contact, thus improving the quality of the resulting ohmic contact. This embodiment of the present invention can be advantageous due to the contiguity of a material containing aluminum ($TiAl_xN_y$, material 602) with the semiconductor material 604 (n-GaN), which allows aluminum atoms to diffuse to the n-GaN material 604 without having to diffuse through another material, potentially permitting quicker formation of the compounds needed for formation of the ohmic contact, allowing for a shorter anneal time, which decreases the probability of thermal defects being formed in the semiconductor structure. An additional advantage of the proximity of the aluminum-containing $TiAl_xN_y$ material 602 to the n-GaN material 604 in this particular embodiment is that less heat can be required during the anneal to generate the desired ohmic contact, which also decreases the probability of thermal defects being formed in the semiconductor structure.

Figure 7:
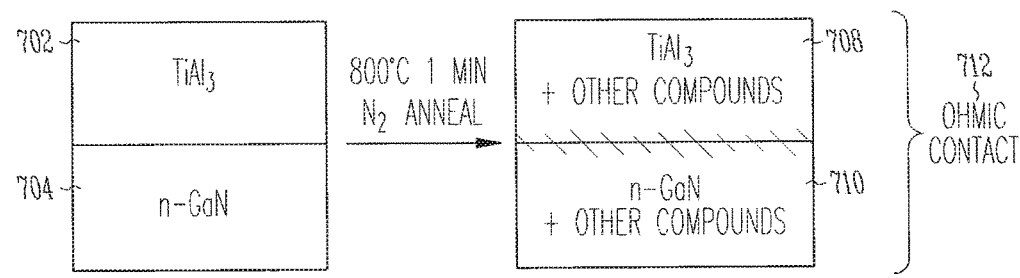
FIG. 7 illustrates a specific embodiment of the present invention, a composition and method for forming an ohmic contact on a semiconductor structure using a $TiAl_3$ material followed by annealing.

Another embodiment of the present invention is shown in FIG. 7 which provides a composition for formation of ohmic contacts on a semiconductor structure, the composition comprising a $TiAl_3$ material 702 at least partially contiguous with the semiconductor structure, comprising the n-GaN material 704. After an annealing process, an ohmic contact 712 is formed. In the ohmic contact 712, the materials have undergone some chemical changes, resulting from atoms diffusing through the materials and generating new compounds. Thus, in the ohmic contact 712, the $TiAl_3$ material 708 can include other compounds not originally present in material 702, and the n-GaN material 710 near to $TiAl_3$ material 708 can include other compounds not originally present in material 704. The melting point of $TiAl_3$ is approximately 1370 degrees C. (FIG. 4). Therefore, the semiconductor structure can be annealed at 800 degrees C. without the disadvantage using a material for formation of the ohmic contact that melts at the annealing temperature, thus improving the surface morphology of the resulting ohmic contact, thus improving the quality of the resulting ohmic contact. This embodiment of the present invention can also be advantageous due to the contiguity of a material containing aluminum ($TiAl_3$, material 702) with the semiconductor material (n-GaN, material 704), which allows aluminum atoms to diffuse to the n-GaN material 704 without having to diffuse through another material, potentially permitting quicker formation of the compounds needed for formation of the ohmic contact, allowing for a shorter anneal time, which decreases the probability of thermal defects being formed in the semiconductor structure. An additional advantage of the proximity of aluminum ($TiAl_3$, material 702) to the n-GaN material 704 in this particular embodiment is that less heat can be required during the annealing process to generate the desired ohmic contact 712, which also decreases the probability of thermal defects being formed in the semiconductor structure.

Figure 8:
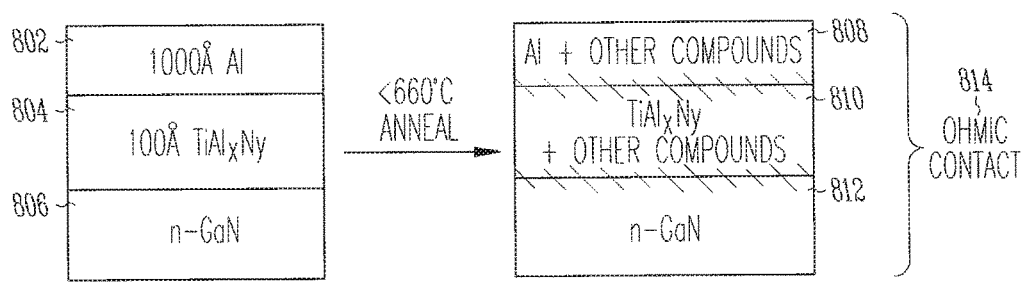
FIG. 8 illustrates a specific embodiment of the present invention, a composition and method of forming an ohmic contact on a semiconductor structure using a $TiAl_xN_y$ material followed by an Al material, followed by annealing.

Another embodiment of the present invention is shown in FIG. 8 which provides a composition for formation of ohmic contacts on a semiconductor structure, the composition comprising a $TiAl_xN_y$ material 804 approximately 100 angstroms thick at least partially contiguous with a semiconductor structure, comprising a n-GaN material 806, and further comprising an aluminum material 802 approximately 1000 angstroms thick that is at least partially contiguous with the $TiAl_xN_y$ material 804. After an annealing process, an ohmic contact 814 is formed. In the ohmic contact 814, the materials have undergone some chemical changes, resulting from atoms diffusing through the materials and generating new compounds. Thus, in the ohmic contact 814, the aluminum material 808 can include other compounds not originally present in material 802, the $TiAl_xN_y$ material 810 can include other compounds not originally present in material 804, and the n-GaN material 812 near to $TiAl_xN_y$ material 810 can include other compounds not originally present in material 806. This embodiment of the present invention can be advantageous due to the continuity of a material containing aluminum ($TiAl_xN_y$, material 804) to the semiconductor material (n-GaN, material 806), which allows aluminum atoms to diffuse to the n-GaN material 806 without having to diffuse through another material, potentially permitting quicker formation of the compounds needed for formation of the ohmic contact, allowing for a shorter anneal time, which decreases the probability of thermal defects being formed in the semiconductor structure. An additional advantage of the proximity of aluminum ($TiAl_xN_y$, material 804) to the n-GaN material 806 in this particular embodiment is that less heat can be required during the anneal to generate the desired ohmic contact, which also decreases the probability of thermal defects being formed in the semiconductor structure.

Figure 9:
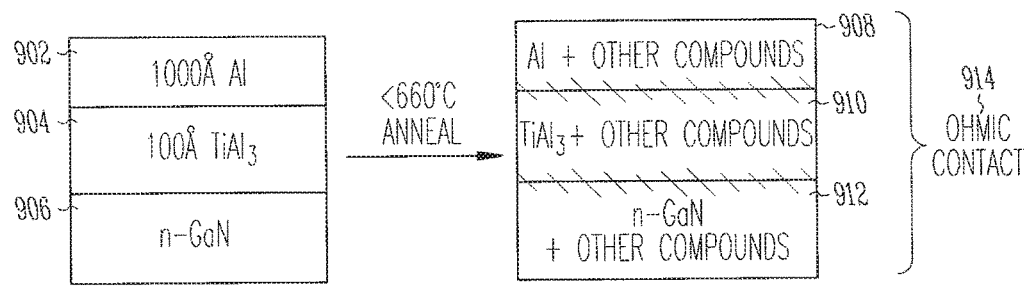
FIG. 9 illustrates a specific embodiment of the present invention, a composition and method of forming an ohmic contact on a semiconductor structure using a $TiAl_3$ material followed by an Al material, followed by annealing.

Another embodiment of the present invention is shown in FIG. 9 which provides a composition for formation of ohmic contacts on a semiconductor structure, the composition comprising a $TiAl_3$ material 904 approximately 100 angstroms thick at least partially contiguous with the semiconductor structure, comprising n-GaN material 906, and additionally includes an aluminum material 902 approximately 1000 angstroms thick at least partially contiguous with the TiAl$_3$ material 904. After an annealing process, an ohmic contact 914 is formed. In the ohmic contact 914, the materials have undergone some chemical changes, resulting from atoms diffusing through the materials and generating new compounds. Thus, in the ohmic contact 914, the aluminum material 908 can include other compounds not originally present in material 902, the TiAl$_3$ material 910 can include other compounds not originally present in material 904, and the n-GaN material 912 near to TiAl$_3$ material 910 can include other compounds not originally present in material 906. This embodiment of the present invention can be advantageous due to the contiguity of a material containing aluminum (TiAl$_3$ material, 904) to the n-GaN material 906, which allows aluminum atoms to diffuse to the n-GaN material 906 without having to diffuse through another material, potentially permitting quicker formation of the compounds needed for formation of the ohmic contact, potentially allowing for a shorter anneal time, which decreases the probability of thermal defects being formed in the semiconductor structure. An additional advantage of the proximity of aluminum (in TiAl$_3$, material 904) to the n-GaN material 906 in this particular embodiment is that less heat can be required during the anneal to generate the desired ohmic contact, which also decreases the probability of thermal defects being formed in the semiconductor structure. Another advantage of less heat being required during the annealing process is avoiding melting the aluminum material 902, which improves the surface morphology of the resulting ohmic contact 914 and improves the quality of the resulting ohmic contact 914.

All publications, patents, and patent applications are incorporated herein by reference. While in the foregoing specification this disclosed subject matter has been described in relation to certain preferred embodiments thereof, and many details have been set forth for purposes of illustration, it will be apparent to those skilled in the art that the disclosed subject matter is susceptible to additional embodiments and that certain of the details described herein can be varied considerably without departing from the basic principles of the disclosed subject matter.

What is claimed is:

1. A method for formation of an ohmic contact, the method comprising:
   depositing TiAl$_3$N$_y$ approximately 50 to 2000 angstroms thick contiguous to at least part of a semiconductor structure, wherein the depositing of the TiAl$_3$N$_y$ is without annealing, wherein the depositing comprises at least one of atomic layer deposition, physical vapor deposition, and chemical vapor deposition, wherein y is 0 to 10; and
   annealing the semiconductor structure and the TiAl$_3$N$_y$ to form the ohmic contact.

2. The method of claim 1, wherein depositing the TiAl$_3$N$_y$ contiguous to at least part of the semiconductor structure comprises depositing the TiAl$_3$N$_y$ at least partially contiguous with an n-doped GaN.

3. The method of claim 1, wherein depositing the TiAl$_3$N$_y$ contiguous to at least part of the semiconductor structure comprises depositing the TiAl$_3$N$_y$ at least partially contiguous with at least one semiconductor material.

4. The method of claim 1, wherein depositing the TiAl$_3$N$_y$ contiguous to at least part of the semiconductor structure comprises depositing the TiAl$_3$N$_y$ at least partially contiguous with at least one semiconductor material which is at least one of undoped, n-doped, and p-doped, wherein the undoped, n-doped, or p-doped semiconductor material comprises in either or both its pre- or post-doped state at least one of GaN, InGaN, AlGaN, AlGaInN, InN, GaAs, AlGaAs, AlGaAs, GaAsP, AlGaInP, GaP, AlGaP, ZnSe, SiC, Si, diamond, BN, AlN, MgO, SiO, ZnO, LiAlO$_2$, SiC, Ge, InAs, InAt, InP, C, Ge, SiGe, AlSb, AlAs, AlP, BP, BAs, GaSb, InSb, Al$_z$Ga$_{1-z}$As, InGaAs, In$_z$Ga$_{1-z}$As, InGaP, AlInAs, AlInSb, GaAsN, AlGaP, AlGaP, InAsSb, InGaSb, AlGaAsP, AlInAsP, AlGaAsN, InGaAsN, InAlAsN, GaAlAsN, GaAsSbN, GaInNAsSb, and GaInAsSbP.

5. The method of claim 1, further comprising manufacturing a light emitting diode (LED) semiconductor device from the semiconductor structure.

6. The method of claim 1, wherein the TiAl$_3$N$_y$ is approximately 50 to 2000 angstroms thick.

7. The method of claim 1, wherein the TiAl$_3$N$_y$ is approximately 200 angstroms thick.

8. The method of claim 1, further comprising depositing aluminum contiguous to at least part of the deposited TiAl$_3$N$_y$ such that the TiAl$_3$N$_y$ is between the semiconductor structure and the aluminum.

9. The method of claim 8, wherein the aluminum is added using at least one of atomic layer deposition, physical vapor deposition (PVD), and chemical vapor deposition (CVD).

10. The method of claim 8, wherein the aluminum is about 5 angstroms to about 4000 angstroms thick.

11. The method of claim 8, wherein the TiAl$_3$N$_y$ is about 25 angstroms to about 300 angstroms thick.

12. The method of claim 1, wherein the annealing takes place at or less than about 500° C. to about 1500° C.

13. The method of claim 1, wherein the annealing takes place at less than about 800° C.

14. The method of claim 1, wherein the annealing takes place for about 0.001 minutes to about 200 minutes.

15. The method of claim 1, wherein the annealing takes place for about 30 seconds to about 60 seconds.

16. The method of claim 1, wherein the TiAl$_3$N$_y$ is TiAl$_3$.

17. A method for formation of an ohmic contact, the method comprising:
   depositing TiAl$_3$ about 200 angstroms to about 2000 angstroms thick contiguous to at least part of an n-doped GaN in a semiconductor structure comprising the n-doped GaN, wherein the depositing of the TiAl$_3$ is without annealing, wherein the depositing comprises at least one of atomic layer deposition, physical vapor deposition, and chemical vapor deposition; and
   annealing the semiconductor structure and the TiAl$_3$ at or less than about 800° C. for a duration of about 30 seconds to about 60 seconds to form the ohmic contact.

18. The method of claim 17, wherein the TiAl$_3$ is formed by the depositing prior to any subsequent annealing, the method further comprising:
   depositing aluminum about 5 angstroms to about 4000 angstroms thick contiguous to at least part of the TiAl$_3$, such that the TiAl$_3$ is between the aluminum and the n-doped GaN; and
   annealing the semiconductor structure and the TiAl$_3$ and the aluminum at or less than about 660° C. to form the ohmic contact.

* * * * *